United States Patent [19]

Tews et al.

[11] Patent Number: 5,070,028
[45] Date of Patent: Dec. 3, 1991

[54] METHOD FOR MANUFACTURING BIPOLAR TRANSISTORS HAVING EXTREMELY REDUCED BASE-COLLECTION CAPACITANCE

[75] Inventors: Helmut Tews, Unterhaching; Hans-Peter Zwicknagl, Stuttgart, both of Fed. Rep. of Germany

[73] Assignee: Siemens Aktiengesellschaft, Munich, Fed. Rep. of Germany

[21] Appl. No.: 678,047

[22] Filed: Apr. 1, 1991

[30] Foreign Application Priority Data

Jun. 7, 1990 [DE] Fed. Rep. of Germany ....... 4018298

[51] Int. Cl.⁵ .................. H01L 21/266; H01L 27/06; H01L 27/10; H01L 21/263
[52] U.S. Cl. ......................... 437/22; 437/24; 437/33; 148/DIG. 10; 357/34
[58] Field of Search ............... 437/31, 133, 24, 89, 437/22; 148/DIG. 10; 357/34, 35

[56] References Cited

U.S. PATENT DOCUMENTS

| | | | |
|---|---|---|---|
| 3,687,722 | 8/1972 | Saxena | 437/24 |
| 4,437,225 | 3/1984 | Mizutani | 437/24 |
| 4,663,831 | 5/1987 | Birrittella et al. | 357/35 |
| 4,682,407 | 7/1987 | Wilson et al. | 437/24 |
| 4,728,616 | 3/1988 | Ankin et al. | 357/34 |
| 4,839,303 | 6/1989 | Tully et al. | 148/DIG. 10 |

FOREIGN PATENT DOCUMENTS

| | | | |
|---|---|---|---|
| 0179547 | 7/1988 | Japan | 437/24 |
| 0241867 | 9/1989 | Japan | 357/16 |

OTHER PUBLICATIONS

Asbeck et al, "GaAs/(Ga,Al)As ... Isolation Layers," IEEE Electron Device Letters, vol. EDL-5, No. 8, 1984, pp. 310-312.

Primary Examiner—Olik Chaudhuri
Assistant Examiner—Loc Q. Trinh
Attorney, Agent, or Firm—Hill, Van Santen, Steadman & Simpson

[57] ABSTRACT

A method for manufacturing a heterobipolar transistor having and at least greatly diminished extrinsic base-collector capacitance provides an insulation implantation in a sub-collector layer grown onto a semi-insulating substrate via a first mask that covers a region provided for the sub-collector to be constructed or the sub-collector is formed by doping the semi-insulating substrate through a mask. The semiconductor layers for the collector, the base and the emitter, the sub-collector being fashioned in a limited region provided therefore and the emitter is aligned on the sub-collector with a second mask.

10 Claims, 2 Drawing Sheets

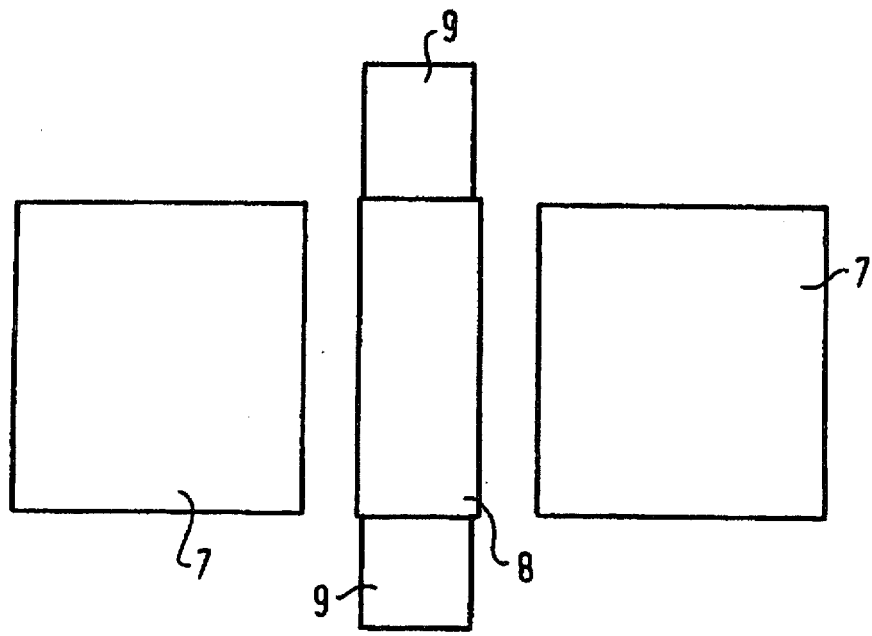
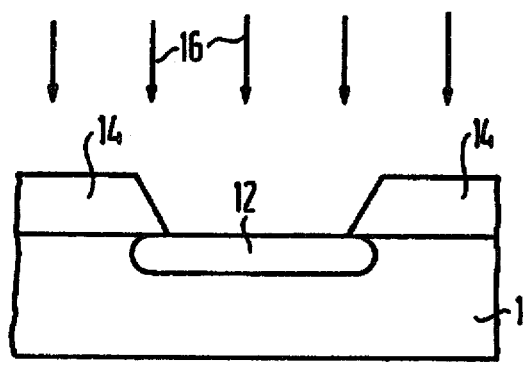

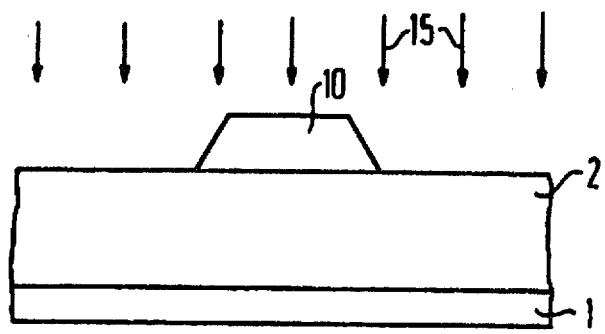
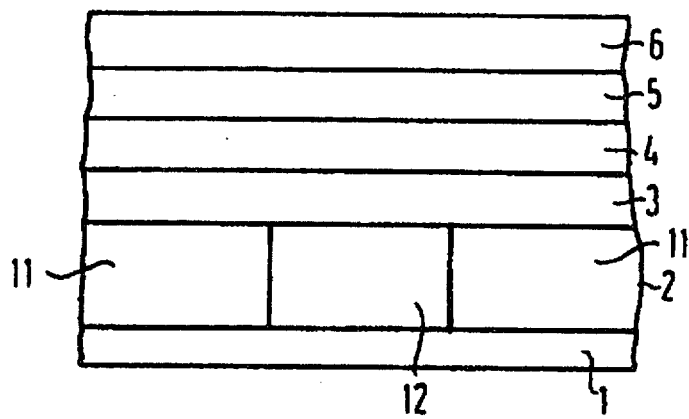
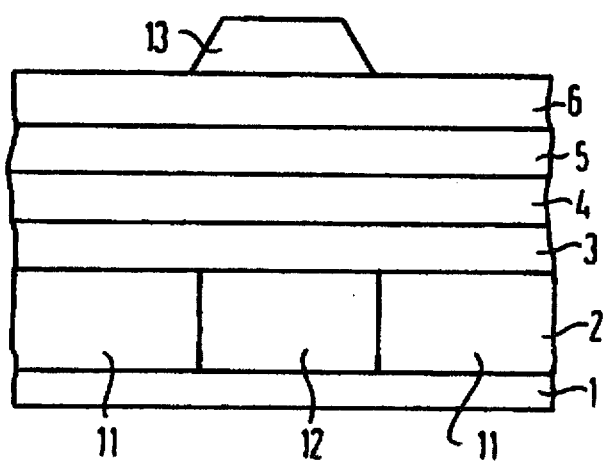

METHOD FOR MANUFACTURING BIPOLAR TRANSISTORS HAVING EXTREMELY REDUCED BASE-COLLECTION CAPACITANCE

BACKGROUND OF THE INVENTION

1. Field of the Invention

The present invention relates to a method for manufacturing a bipolar transistor on a substrate of semiconductor material in which a collector layer, a base layer and an emitter layer for the formation of the collector, the base and the emitter, respectively, are grown on top of one another.

2. Description of the Prior Art

In gallium arsenide-gallium aluminum arsenide (GaAs-GaAlAs) heterobipolar transistors, the transit frequency and the maximum oscillation frequency are greatly influenced by parasitic capacitances and series resistances. Examples of parasitic capacitances are the capacitances between the emitter layer and the base layer or between the base layer and the collector layer outside of the inner transistor region. In order to achieve high values for the maximum oscillation frequency, the path resistance of the base and the base-collector capacitance must be minimized.

It is fundamentally possible to reduce parasitic capacitances by miniaturizing structures, particularly by reducing the distance between the base and the emitter contacts or, respectively, between the base and the collector contacts. A further possibility of reducing the extrinsic base-collector capacitance is offered by an isolation implantation (for example, oxygen) in the extrinsic base-collector region and disclosed by P. M. Asbeck, D. L. Miller, R. J. Anderson and F. H. Eisen, in the IEEE Electron Device Letters publication, Vol. 5, 1984, pp. 310–312. The high implantation energies needed are thereby disadvantageous. These high implantation energies require masks of metal. Moreover, the implantations also cause damage in the upper base layers, this damage disadvantageously modifying the transistor properties.

SUMMARY OF THE INVENTION

It is an object of the present invention to provide a simply implementable manufacturing method for bipolar transistors whose characteristics are not deteriorated in comparison to bipolar transistors manufactured according to traditional methods and that comprise a minimum base-collector capacitance.

The above object is achieved, according to the present invention, by a method for manufacturing a bipolar transistor on a substrate of semiconductor material, in which a collector layer, a base layer and an emitter layer for the formation of the collector, the base and the emitter, respectively, are grown on top of one another and is particularly characterized in that a subcollector is fashioned before the growth of the collector layer, of the base layer and of the emitter layer, the subcollector being fashioned in a limited region provided for that purpose that embraces the region of the emitter and a region provided for a collector terminal.

The method generally set forth above is particularly characterized in that a subcollector layer is grown onto the substrate, in that an insulation implantation is undertaken utilizing a first mask that covers the region provided for the subcollector, and in that, after removal of the first mask and after growing the collector layer, the base layer and the emitter layer, the emitter is constructed aligned on the subcollector utilizing a second mask.

Another feature of the invention of the method generally set forth above provides that the method is particularly characterized in that a doping is implanted into the substrate utilizing a first mask that leaves the region provided for the sub-collector free, and in that, after removing the first mask and after growing the collector layer, the base layer and the emitter layer, the emitter is constructed aligned on the sub-collector utilizing a second mask.

According to another feature of the invention, the method set forth above is particularly characterized in that the substrate is a semi-insulating GaAs material, and that the semiconductor materials from the system GaAs/GaAlAs are grown on for the collector layer, the base layer and the emitter layer.

According to another feature of the invention, the method generally set forth above is particularly characterized in that the substrate is a semi-insulating InP material, and in that the semiconductor materials from the system InP/InGaAs are grown on for the collector layer, the base layer and the emitter layer.

According to another feature of the invention, the method generally set forth above is particularly characterized in that the substrate is a semi-insulating Si material, and in that the semiconductor materials from the system Si/SiGe are grown on for the collector layer, the base layer and the emitter layer.

According to another feature of the invention, the method generally set forth above is particularly characterized in that the sub-collector, the collector layer and the emitter layer are n doped.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 1 is a plan view of a finished transistor having the arrangement of the contacts for the base, the emitter and the collector;

FIGS. 2–4 illustrate the transistor in cross-sectional views in three different method steps; and FIG. 5 illustrates the method step according to FIG. 2 in an alternative embodiment.

DESCRIPTION OF THE PREFERRED EMBODIMENTS

The manufacturing method of the present invention avoids the subsequent insulation implantation in that a sub-collector region locally limited to the inner transistor is fashioned by lateral insulation implantation before the growth of the actual transistor layers. A base contact 7, an emitter contact 8 and a collector contact 9 are illustrated in the plan view of FIG. 1. The area occupied by the sub-collector manufactured in accordance with the present invention embraces the regions occupied by the emitter contact 8 and the collector contact 9.

In a first exemplary embodiment of the method of the present invention, a sub-collector layer 2 that is highly doped for good conductivity is deposited onto a substrate 1. The substrate 1 is of insulating semiconductor material and is advantageously provided with adjustment or registration marks. The region provided for the sub-collector is covered with a first mask 10 (see FIG. 2). This covered region of the sub-collector only has the size of the inner transistor (i.e. essentially of the emitter region) plus a lateral lead-out for the later collector connection by a contact on the sub-collector 12 (FIG. 3). The remaining part of the sub-collector layer 2 is insulated by an insulation implantation 15 (for example, oxygen) or the electrical conductivity of this part of the sub-collector layer 2 is at least greatly diminished by this insulation implantation 15.

After the first mask 10 is removed and the surface of the sub-collector layer 2 is cleaned, the further layers for the bipolar transistor are epitaxially grown. FIG. 3 illustrates the grown layers, namely the collector layer 3, the base layer 4, the emitter layer 5 and a cover layer 6. The following method steps that are particularly directed to the structuring of the emitter-base complex correspond to those processes known from the prior art. The emitter region to be structured is aligned relative to the sub-collector region defined by the alignment marks defined with the first mask 10. To this end, a second mask 13 is required, as illustrated in FIG. 4. The sub-collector 12 and the insulating regions 11 that were treated by the insulation implantation 15 and laterally limit the sub-collector 12 are illustrated in FIGS. 3 and 4. A part of the cover layer 6 and of the emitter layer 5 is then etched away for the contacting of the base in a later method step.

A particular advantage of the method of the present invention lies in the fact that the collector layer 3 is depleted of charge carriers in the regions above the insulating regions 11 of the sub-collector 2 and therefore makes no contribution to the base-collector capacitance. When the sub-collector layer 2 is completely insulated under the base terminal, i.e. when the base contacts 7 are located above the insulating regions 11 in the vertical projection and completely insulates these regions 11, then the extrinsic, "parasitic" base-collector capacitance is practically equal to zero.

The method step corresponding to FIG. 2 is illustrated in an alternative exemplary embodiment in FIG. 5. In this second exemplary embodiment, the first mask is now a mask 14 and is applied directly onto the substrate 1 of, for example, GaAs. This first mask 14 leaves the region provided for the sub-collector 3, i.e. just covers that part of the substrate surface that is complementary to the first exemplary embodiment. An implantation 16 for doping is then undertaken through this opening of the first mask 14, as a result of which the initial semi-insulating substrate 1 becomes conductive in the region provided for the sub-collector 12. Subsequently, the first mask 14 is removed, the surface of the substrate is cleaned and the doping is annealed. The same method steps as in the first exemplary embodiment then follow, i.e. the growth of the layers corresponding to FIG. 3. The remaining method steps correspond to those of the first exemplary embodiment.

In a conventionally-manufactured, self-aligned heterobipolar transistor having an emitter with an area of, for example, $5 \times 2 \mu m^2$ and having two base contacts of the same size, ⅛ of the total base-collector capacitance devolves onto the "parasitic" extrinsic base-collector capacitance. According to the particulars in the literature, the extrinsic base-collector capacitance can be diminished by roughly a factor of 2 by the insulating implantation with oxygen through the finished layer sequence of the transistor in conformity with the prior art, i.e. only about half the base-collector capacitance then devolves into the contribution due to the extrinsic base-collector capacitance. The collector charging time and the emitter charging time are significantly shortened as a consequence thereof. The method of the present invention not only allows the simple execution of the insulation implantation but, in addition, enables a practically complete elimination of the extrinsic base-collector capacitance, i.e. the base-collector capacitance is reduced to ⅛ in comparison to traditional transistors. Avoiding the parasitic, extrinsic base-collector capacitance offers further advantages including the terminal regions for the base contacts 7 can be selected larger when, for example, lower base-contact resistances are required, for example for increasing the maximum oscillation frequency, since the extrinsic base-collector capacitance need no longer be taken into consideration.

The method of the present invention can be employed in all systems of materials wherein further layers, i.e. the collector layer 3, the base layer 4 and the emitter layer 5 are grown onto a semi-insulating substrate. Such systems of materials are, for example, GaAs/GaAlAs, InP/InGaAs and Si/SiGe.

Although we have described out invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a method for manufacturing a bipolar transistor arranged on a substrate of semiconductor material, and of the type in which a collector layer, a base layer and an emitter layer for the formation of a collector, a base and an emitter are grown on the substrate on top of one another, the improvement comprising the steps of:
   (a) prior to the growing of the collector layer, the base layer and the emitter layer, applying a highly-doped sub-collector layer onto the substrate;
   (b) masking the sub-collector layer with a first mask to cover only that portion allocated to the sub-collector to be formed;
   (c) insulating the uncovered areas of the sub-collector layer by insulation implantation;
   (d) removing the first mask;
   (e) growing the collector layer, the base layer and the emitter layer in that sequence on top of one another on the sub-collector layer;
   (f) applying a cover layer over the emitter layer;
   (g) applying a second mask on the cover layer to cover a portion of the emitter layer therebelow and define the limits of the emitter to be formed;
   (h) etching away the cover layer and the emitter layer outside of the defined emitter area covered by the second mask; and
   (i) removing the second mask.

2. The method of claim 1, wherein the steps (a) and (e) of applying a highly-doped sub-collector layer and growing the collector layer, the base layer and the emitter layer are further defined as:
   (a1) growing a highly-doped sub-collector onto a semi-insulating GaAs substrate; and
   (e1) growing successive layers of the GaAs/GaAlAs system of semiconductor materials onto the highly-doped sub-collector layer as the collector layer, the base layer and the emitter layer.

3. The method of claim 1, wherein the steps (a) and (e) of applying a highly-doped sub-collector layer and growing the collector layer, the base layer and the emitter layer are further defined as:
 (a1) growing a highly-doped sub-collector onto a semi-insulating InP substrate; and
 (e1) growing successive layers of the InP/InGaAs system of semiconductor materials onto the highly-doped sub-collector layer as the collector layer, the base layer and the emitter layer.

4. The method of claim 1, wherein the steps (a) and (e) of applying a highly-doped sub-collector layer and growing the collector layer, the base layer and the emitter layer are further defined as:
 (a1) growing a highly-doped sub-collector onto a semi-insulating Si substrate; and
 (e1) growing successive layers of the Si/SiGe system of semiconductor materials onto the highly-doped sub-collector layer as the collector layer, the base layer and the emitter layer.

5. The method of claim 1, and further comprising the step of:
 (j) doping the sub-collector layer, the collector layer and the emitter layer with n-conductivity dopant.

6. In a method for manufacturing a bipolar transistor arranged on a substrate of semiconductor material, and of the type in which a collector layer, a base layer and an emitter layer for the formation of a collector, a base and an emitter are grown on the substrate on top of one another, the improvement comprising the steps of:
 (a) prior to the growing of the collector layer, the base layer and the emitter layer, masking a semi-insulating substrate with a first mask to leave uncovered only that portion allocated to the sub-collector to be formed;
 (b) doping the uncovered portion of the substrate through the first mask to render the uncovered portion conductive and thereby form a sub-collector;
 (c) removing the first mask;
 (d) growing the collector layer, the base layer and the emitter layer on top of the substrate and covering the sub-collector;
 (e) applying a cover layer over the emitter layer;
 (f) applying another mask on the cover layer to cover a portion of the emitter layer below and define the limits of the emitter to be formed;
 (g) etching away the cover layer and the emitter layer outside of the defined emitter area covered by the second mask; and
 (h) removing the second mask.

7. The method of claim 6, wherein the step (d) of growing the collector layer, the base layer and the emitter layer is further defined as:
 (d1) growing successive layers of the GaAs/GaAlAs system of semiconductor materials onto the substrate covering the doped sub-collector layer as the collector layer, the base layer and the emitter layer.

8. The method of claim 6, wherein the step (d) of growing the collector layer, the base layer and the emitter layer is further defined as:
 (d1) growing successive layers of the InP/InGaAs system of semiconductor materials onto the substrate covering the doped sub-collector layer as the collector layer, the base layer and the emitter layer.

9. The method of claim 6, wherein the step (d) of growing the collector layer, the base layer and the emitter layer is further defined as:
 (d1) growing successive layers of the Si/SiGe system of semiconductor materials onto the substrate covering the doped sub-collector layer as the collector layer, the base layer and the emitter layer.

10. The method of claim 6, and further comprising the step of:
 (j) doping the sub-collector layer, the collector layer and the emitter layer with n-conductivity dopant.

* * * * *